United States Patent
Strachan et al.

(10) Patent No.: US 6,566,710 B1
(45) Date of Patent: May 20, 2003

(54) POWER MOSFET CELL WITH A CROSSED BAR SHAPED BODY CONTACT AREA

(75) Inventors: Andy Strachan, Sunnyvale, CA (US); Douglas Brisbin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/942,480

(22) Filed: Aug. 29, 2001

(51) Int. Cl.[7] .................. H01L 29/76; H01L 29/94; H01L 31/062; H01L 31/113; H01L 31/119
(52) U.S. Cl. .................. 257/341; 257/401
(58) Field of Search .................. 257/331, 341, 257/401

(56) References Cited

U.S. PATENT DOCUMENTS 5,136,349 A * 8/1992 Yilmaz et al. .................. 357/23
6,413,822 B2 * 7/2002 Williams et al. .................. 438/270

OTHER PUBLICATIONS

P.L. Hower et al., "Snapback and Safe Operating Area of Ldmos Transistors", IEDM 99, pp. 193–196.

* cited by examiner

*Primary Examiner*—Phat X. Cao
(74) *Attorney, Agent, or Firm*—Mark C. Pickering

(57) ABSTRACT

The safe operating area of a high-voltage MOSFET, such as a lateral double-diffused MOS (LDMOS) transistor, is increased by using transistor cells with an X-shaped body contact region and four smaller source regions that adjoin the body contact region. The X-shaped body contact region lowers the parasitic base resistance of the transistor, thereby increasing the safe operating area of the transistor.

6 Claims, 11 Drawing Sheets

POWER MOSFET CELL WITH A CROSSED BAR SHAPED BODY CONTACT AREA

BACKGROUND OF THE INVENTION

1. Field of the Invention

The present invention relates to power MOSFETs and, more particularly, to a power MOSFET cell with a crossed bar shaped body contact area.

2. Description of the Related Art

A power MOSFET is a high-voltage transistor that conducts large amounts of current when turned on. A lateral double-diffused MOS (LDMOS) transistor is one type of power MOSFET. LDMOS transistors are commonly implemented with a checkerboard pattern of drain and source regions rather than with a single drain region and a single source region. With this type of transistor, adjacent drain and source regions, known as transistor cells, each contribute a portion of the total current output by the transistor.

FIG. 1 shows a plan view that illustrates a conventional checkerboard-patterned, n-channel LDMOS transistor 100. FIG. 2 shows a cross-sectional diagram of transistor 100 taken along lines 2—2 of FIG. 1, while FIG. 3 shows a cross-sectional diagram of transistor 100 taken along lines 3—3 of FIG. 1.

As shown in FIGS. 1–3, transistor 100, which is formed on a p– semiconductor substrate 110, includes an n+ buried layer 112 that is formed on substrate 110, and an n drift layer 114 that is formed on buried layer 112. Transistor 100 also includes an alternating pattern of n– field regions 116 and p– body regions 118 that are formed in layer 114.

Further, transistor 100 includes a checkerboard pattern of n+ drain and source regions 120 and 122, respectively, that are formed in n– regions 116 and p– regions 118, respectively. Source region 122 can have a variety of shapes including a square shape (as shown in FIG. 1), a hexagonal shape, and a circular shape. Adjacent drain and source regions 120 and 122, in turn, define a number of transistor cells 124.

Thus, as shown in FIG. 1, except for the drain regions 120 on the outside edge of the pattern, each drain region 120 is a part of four transistor cells 124. Similarly, except for the source regions 122 on the outside edge of the pattern, each source region 122 is a part of four transistor cells 124. As a result, the center source region 122 shown in FIG. 1 receives current from four drain regions 120: the drain region directly above the center region, the drain region directly below the center region, the drain region directly left of the center region, and the drain region directly right of the center region.

Transistor 100 additionally includes a number of p+ contact regions 126 that are formed in p– regions 118 adjacent to source region 122, and a number of n– regions 130 that are formed in p– regions 118 adjacent to source region 122. Transistor 100 also includes a number of field oxide regions FOX that surround drain regions 120, and a layer of gate oxide 132 that is formed over a portion of each body region 118 and an adjoining drift region 114. The field oxide region FOX separates drain region 120 from source region 122. (Drain region 120 and source region 122 can alternately be separated by a gap.)

Further, a gate 134 is formed between each drain and source region 120 and 122 on gate oxide layer 132 and the adjoining field oxide region FOX. In addition, an oxide spacer 136 is formed adjacent to each gate 134 over n– region 130. A salicide layer is also formed on each drain region 120 to form drain contacts 138, source region/contact region 122/126 to form source body contacts 140, and gate 134 to form gate contacts 142.

In operation, when the junction of drift region 114 and p– body region 118 of a transistor cell 124 is reverse biased, such as when a positive voltage is applied to drain contact 138 and ground is applied to source body contact 140 of the cell, an electric field is established across the junction. The electric field, in turn, forms a depletion region around the junction that is free of mobile charge carriers.

When the voltage on drain contact 138 of the cell is increased, the strength of the electric field is also increased. When the voltage on drain contact 138 exceeds a snapback voltage, mobile charge carriers in the depletion region, such as electrons from thermally-generated, electron-hole pairs, are accelerated under the influence of the electric field into having ionizing collisions with the lattice.

The ionizing collisions, in turn, form more mobile charge carriers which then have more ionizing collisions until, by a process known as avalanche multiplication, a current flows across the junction between drift region 116 and p– body 118. The holes that flow into p– body region 118 are collected by p+ contact region 126, while the electrons that flow into drift region 118 are collected by drain region 120.

As shown in FIG. 1, the holes flowing through p– body region 118 to p+ region 126 can follow a number of paths that include a short path 160 that has the shortest length Lp and a long path 162 that has the longest-length Lw (where Lw=Lp*sqrt(2)). For example, if a hole is generated at point A in FIG. 1, the shortest path from point A to p+ region 126 is along a line L1 that includes length Lp.

The holes flowing through p– body region 118 generate a local voltage drop due to a parasitic body resistance. When the local voltage drop becomes large enough, such as when the voltage on drain region 120 exceeds the snapback voltage, the local voltage forward biases the p– body region 118 to n+ source region 122 junction. Forward biasing the junction, in turn, turns on a parasitic npn transistor. At this point, the cell enters a negative resistance region, known as the snapback region, and device failure typically occurs.

FIG. 4 shows a cross-sectional diagram that illustrates a single transistor cell 124. As shown in FIG. 4, cell 124 includes a parasitic npn transistor 410 and a parasitic body resistance Rb. Body resistance Rb is formed by the n+ source region 122 pinching the p– body region 118. Resistance Rb is high, having a typical value of 5,000 ohms/square for a 30V LDMOS process.

FIG. 5 shows a graph that illustrates a typical drain current characteristic of LDMOS transistor cell 124. As shown in FIG. 5, a range of drain-to-source voltages Vds is plotted against a range of drain-to-source currents Ids. A number of gate-to-source voltage Vgs curves are plotted in FIG. 5. On each curve is a circle that represents the snapback voltage.

In addition, a snapback line 510 is defined by joining together the snapback voltage circles on each gate-to-source curve. A safe operating area (SOA) 512, in turn, is defined as the positive region to the left of snapback line 510. The drain-to-source and gate-to-source voltage combinations that fall outside of safe operating area 512 typically lead to device failure.

As further shown in FIG. 5, as the gate-to-source voltage Vgs increases (by increasing the gate voltage when the source is connected to ground), LDMOS transistor 100 snaps back at lower and lower drain-to-source voltages (lower drain voltages when the source is connected to ground).

Although LDMOS transistor 100 operates satisfactorily, the restricted range of the safe operating area limits the usefulness of transistor 100. Thus, there is a need for an LDMOS transistor with a larger safe operating area.

SUMMARY OF THE INVENTION

The present invention increases the safe operating area of a transistor by utilizing transistor cells with a crossed bar shaped body contact region and at least one smaller source region that adjoins the body contact region. The crossed bar shaped body contact region lowers the parasitic base resistance of the transistor which, in turn, increases the safe operating area.

A transistor in accordance with the present invention includes a first region of semiconductor material that has a first conductivity type and a first dopant concentration, and a second region of semiconductor material that has a second conductivity type and a second dopant concentration. The second region adjoins the first region.

The transistor also includes a third region of semiconductor material that has the first conductivity type and a third dopant concentration. The third region has a crossed bar shape and adjoins the first region and the second region. In addition, the third dopant concentration is greater than the first dopant concentration.

The transistor further includes a fourth region of semiconductor material that has the second conductivity type and a fourth dopant concentration. The fourth region of semiconductor material adjoins the first region of semiconductor material and is spaced apart from the second region of semiconductor material.

A better understanding of the features and advantages of the present invention will be obtained by reference to the following detailed description and accompanying drawings that set forth an illustrative embodiment in which the principles of the invention are utilized.

DETAILED DESCRIPTION

Figure 6:
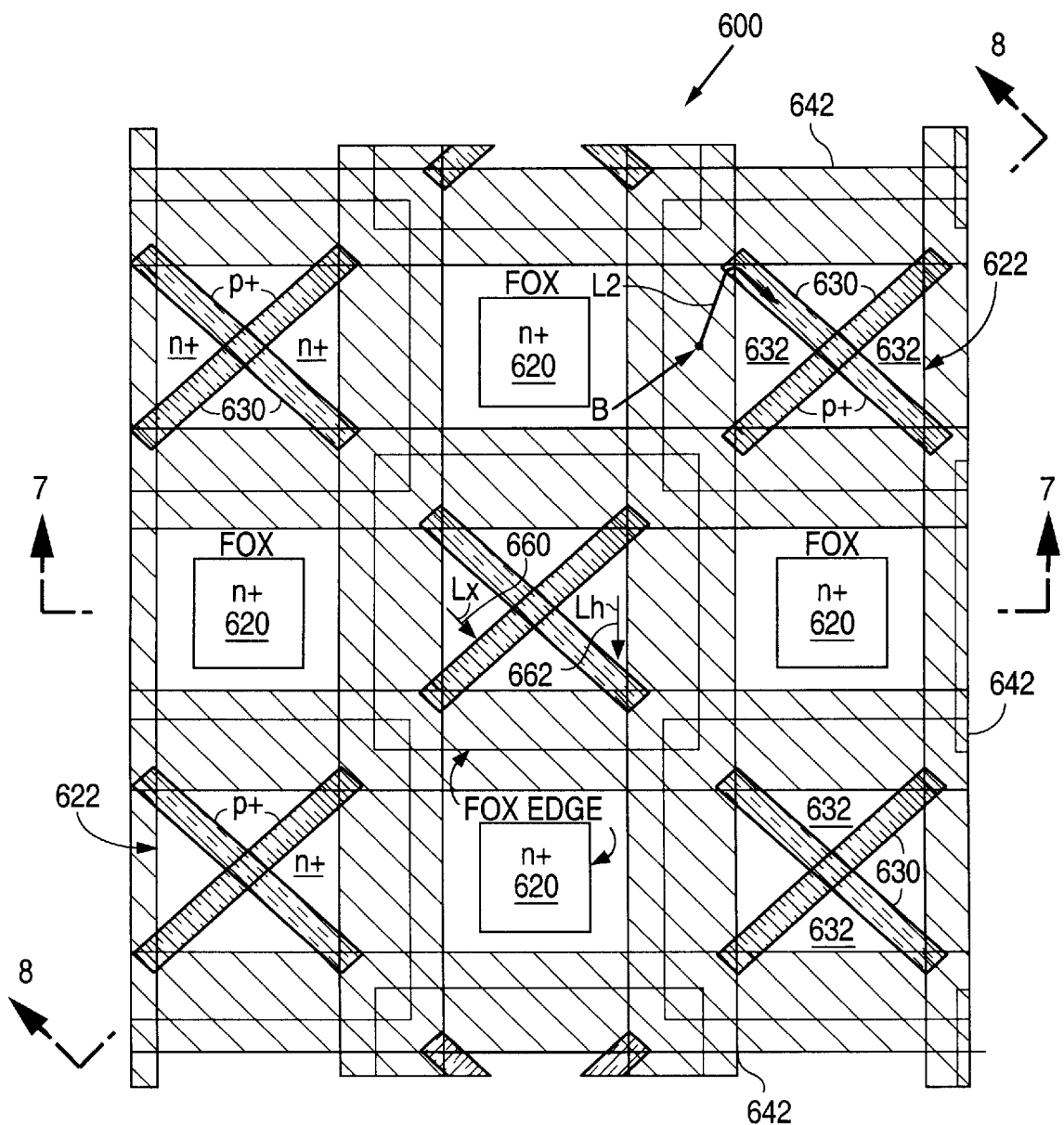
FIG. 6 is a plan view illustrating a checkerboard-patterned, n-channel LDMOS transistor 600 in accordance with the present invention.
Figure 7:
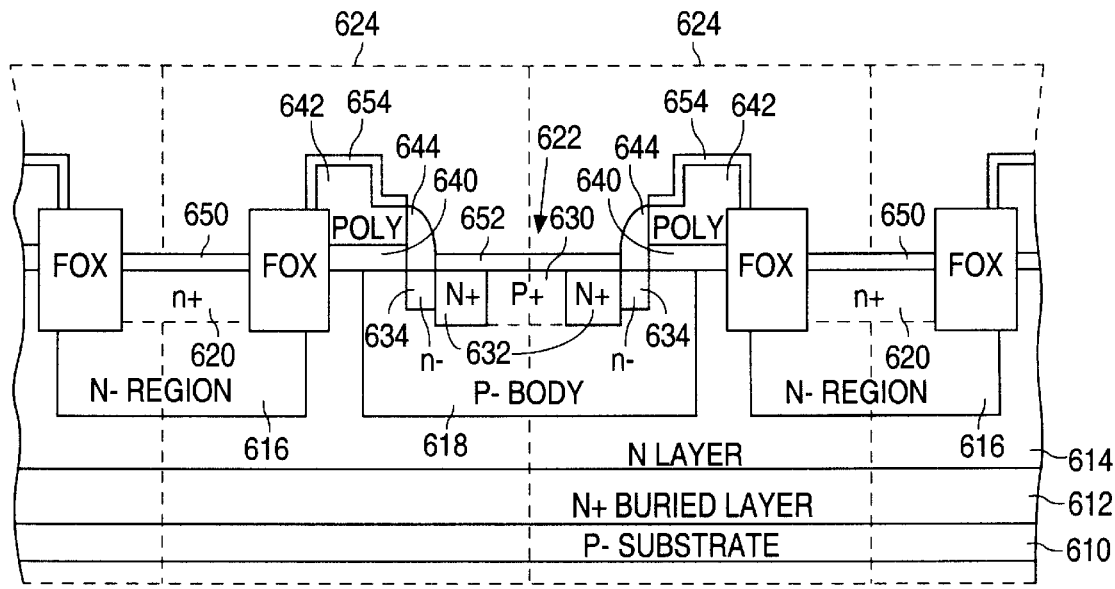
FIG. 7 is a cross-sectional diagram of transistor 600 taken along lines 7—7 of FIG. 6.

FIG. 6 shows a plan view that illustrates a checkerboard-patterned, n-channel LDMOS transistor 600 in accordance with the present invention. FIG. 7 shows a cross-sectional diagram of transistor 600 taken along lines 7—7 of FIG. 6, while FIG. 8 shows a cross-sectional diagram of transistor 600 taken along lines 8—8 of FIG. 6.

As described in greater detail below, the present invention increases the safe operating area of a transistor by lowering the parasitic base resistance of the transistor. The parasitic base resistance, in turn, is lower by utilizing transistor cells with a crossed bar body contact region, such as an X-shape or a +- shape, and four smaller source regions that adjoin the body contact region.

Figure 8:
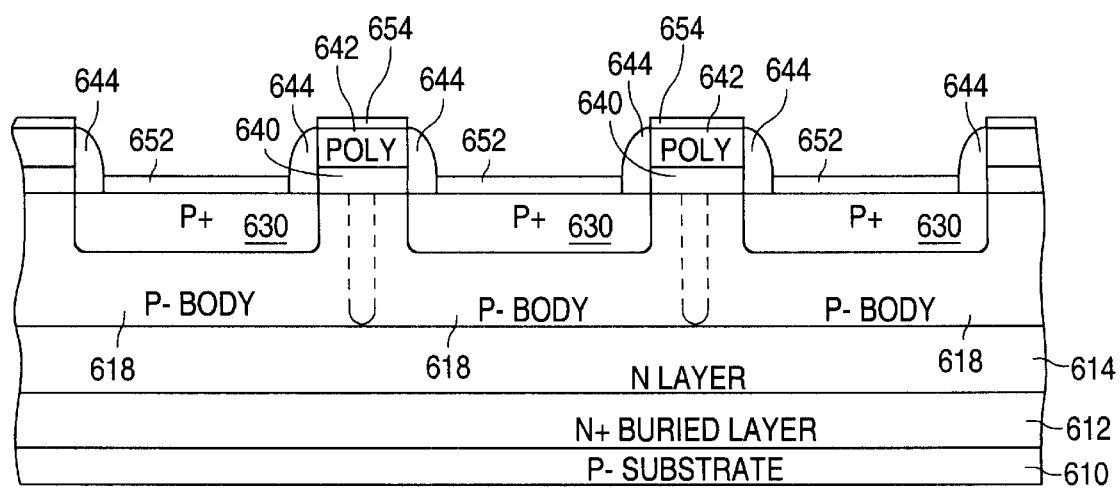
FIG. 8 is a cross-sectional diagram of transistor 600 taken along lines 8—8 of FIG. 6.

As shown in FIGS. 6–8, transistor 600, which is formed on a p− semiconductor substrate 610, includes an n+ buried layer 612 that is formed on substrate 610, and an n drift layer 614 that is formed on buried layer 612. Transistor 600 also includes an alternating pattern of n− field regions 616 and p− body regions 618 that are formed in layer 614.

Further, transistor 600 includes a checkerboard pattern of n+ drain regions 620 and combined regions 622 that are formed in n− regions 616 and p− regions 618, respectively. Adjacent drain and combined regions 620 and 622, in turn, define a number of transistor cells 624.

A combined region 622 includes a crossed bar p+ region 630 that is formed in p− body region 618, and a number of n+ regions 632 that are formed in p− body region 618 adjacent to p+ region 630. In the present invention, combined region 622 has a square shape, p+ region 630 has an X shape, and four n+ regions 632 are formed in p− body region 618 and separated from each other by p+ region 630.

As further shown in FIG. 6, transistor 600 also includes a number of field oxide regions FOX that surround drain regions 620, and a layer of gate oxide 640 that is formed over a portion of each body region 618 and an adjoining drift region 614. Further, a gate 642 is formed between each drain and combined region 620 and 622 on gate oxide layer 630 and an adjoining field oxide region FOX.

In addition, an oxide spacer 644 is formed adjacent to each gate 642 over n− region 634. A salicide layer is also formed on each drain region 620 to form drain contacts 650, combined region 622 to form source body contacts 652, and gate 642 to form gate contacts 654.

Figure 4:
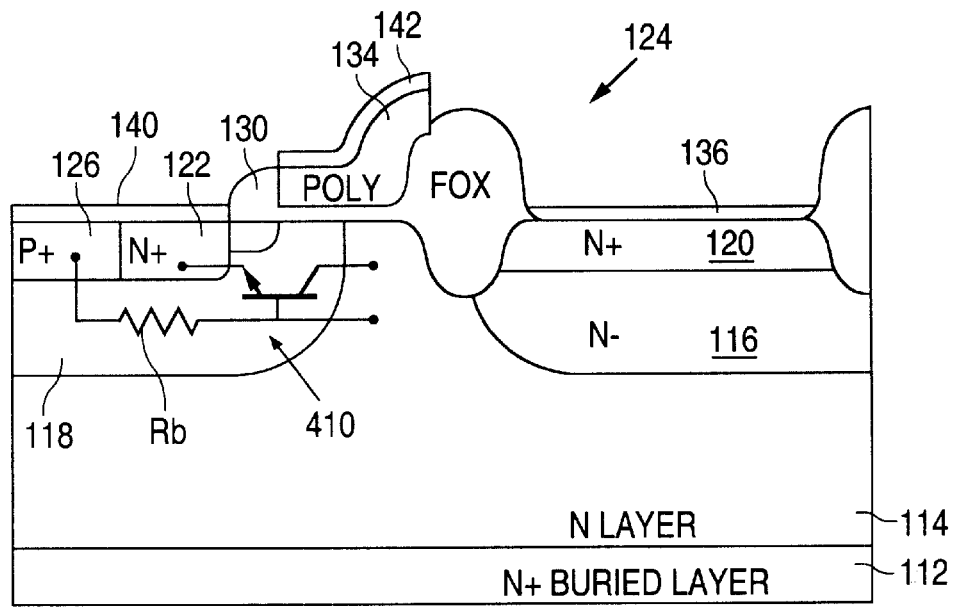
FIG. 4 is a cross-sectional diagram that illustrates a single transistor cell 124.
Figure 5:
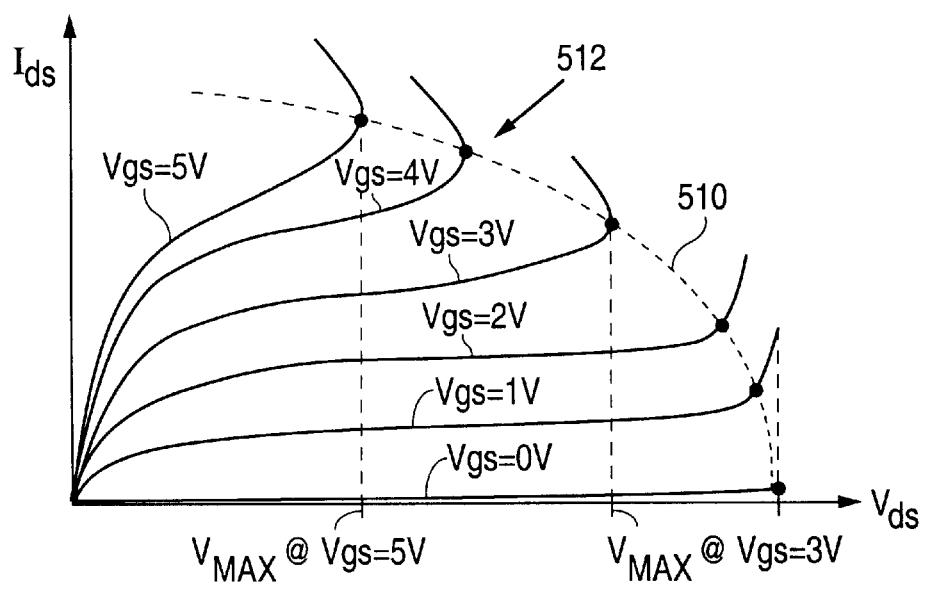
FIG. 5 is a graph illustrating a typical drain current characteristic of LDMOS transistor cell 124.

In operation, transistor 600 operates the same as a conventional LDMOS transistor except that the X-shaped p+ region of the present invention substantially reduces the parasitic body resistance (resistance Rb in FIG. 4) which, in turn, increases the safe operating area of transistor 600.

When the junction of drift region 614 and p− body region 618 of a transistor cell 624 is reverse biased, such as when a positive voltage is applied to drain contact 650 and ground is applied to source body contact 652 of the cell, an electric field is established across the junction. The electric field, in turn, forms a depletion region around the junction that is free of mobile charge carriers. When the voltage on drain contact 650 of the cell is increased, the strength of the electric field is also increased.

Figure 1:
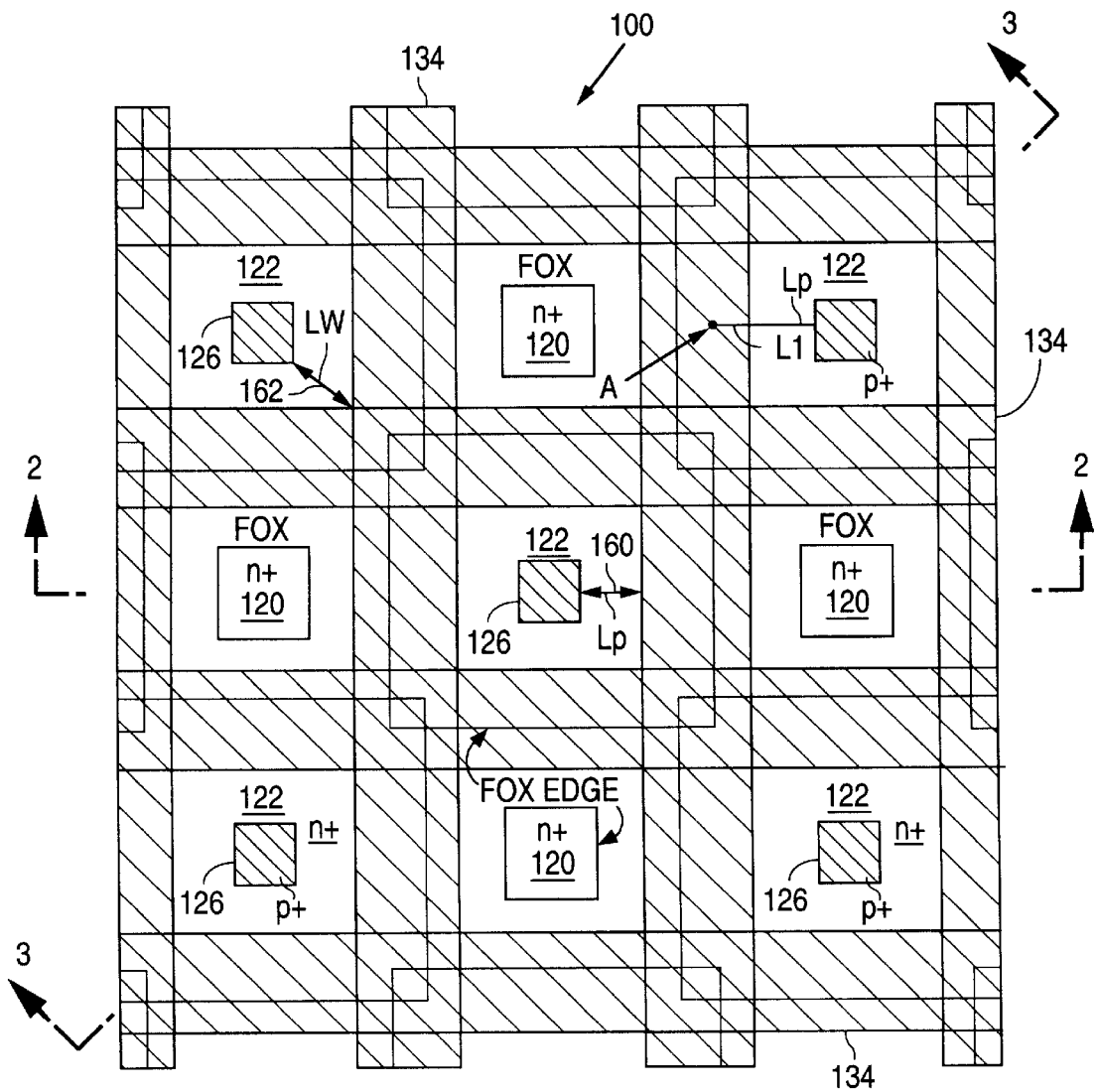
FIG. 1 is a plan view illustrating a conventional checkerboard-patterned, n-channel LDMOS transistor 100.
Figure 2:
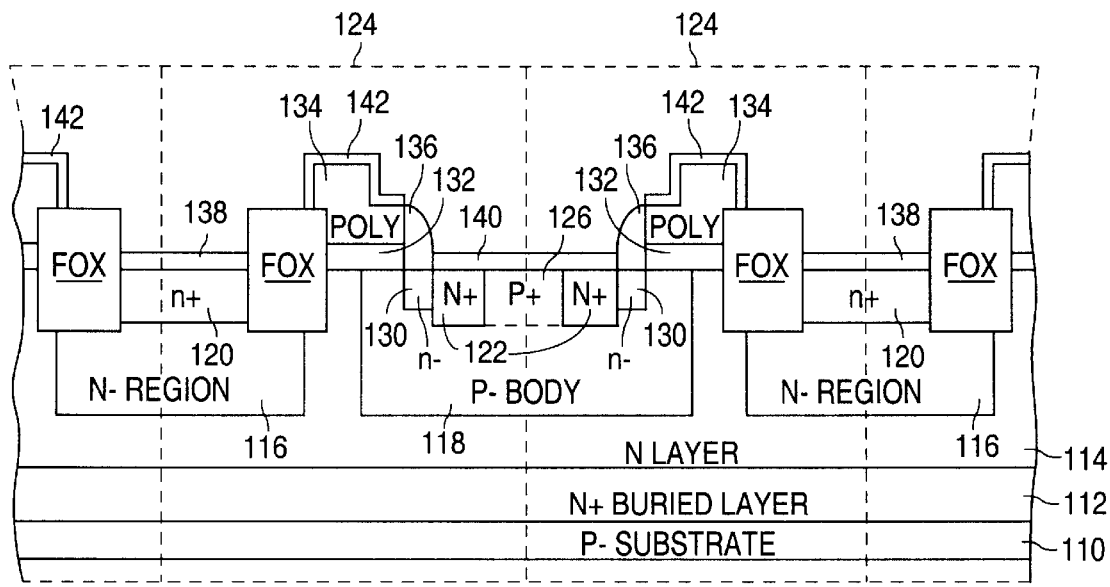
FIG. 2 is a cross-sectional diagram of transistor 100 taken along lines 2—2 of FIG. 1.
Figure 3:
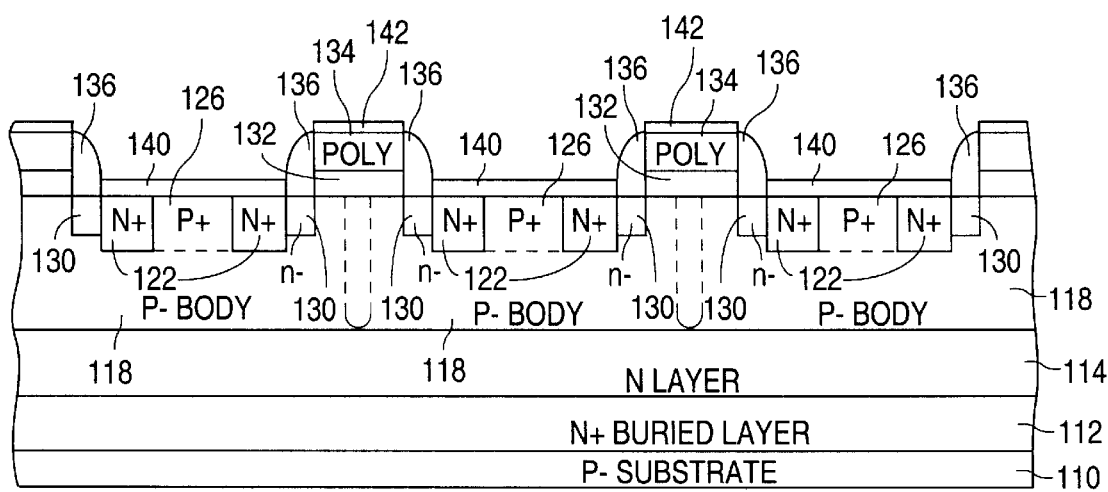
FIG. 3 is a cross-sectional diagram of transistor 100 taken along lines 3—3 of FIG. 1.

When a hole is formed within the depletion region or diffuses into the depletion region, the hole is injected into p– body region 618 under the influence of the electric field across the junction. Once injected, the hole can follow a number of paths to reach p+ region 630. As shown in FIG. 6, these paths include a short path 660 that has the shortest length Lx and a long path 662 that has the longest length Lh. In the present invention, length Lx of the shortest path 660 is shorter than length Lp of transistor 100 (FIG. 1). As a result, short path 660 has a smaller resistance than short path 160.

Although path 660 is shorter than path 662, most holes will follow long path 662 due to the differences in resistance. For example, if a hole is generated at point B in FIG. 6, the holes will likely follow line L2 to reach p+ region 630. This is because holes following short path 660 must flow underneath n+ region 632 where p– body region 618 has a sheet resistance of approximately 5,000 Ω/square in a 30V process. On the other hand, the resistance of p– body region 618 under gate 642 in the same 30V process has a sheet resistance of approximately 1,800 Ω/square. Thus, due to the difference is resistance, path 662, although longer, provides a lower resistance than short path 660.

Figure 9:
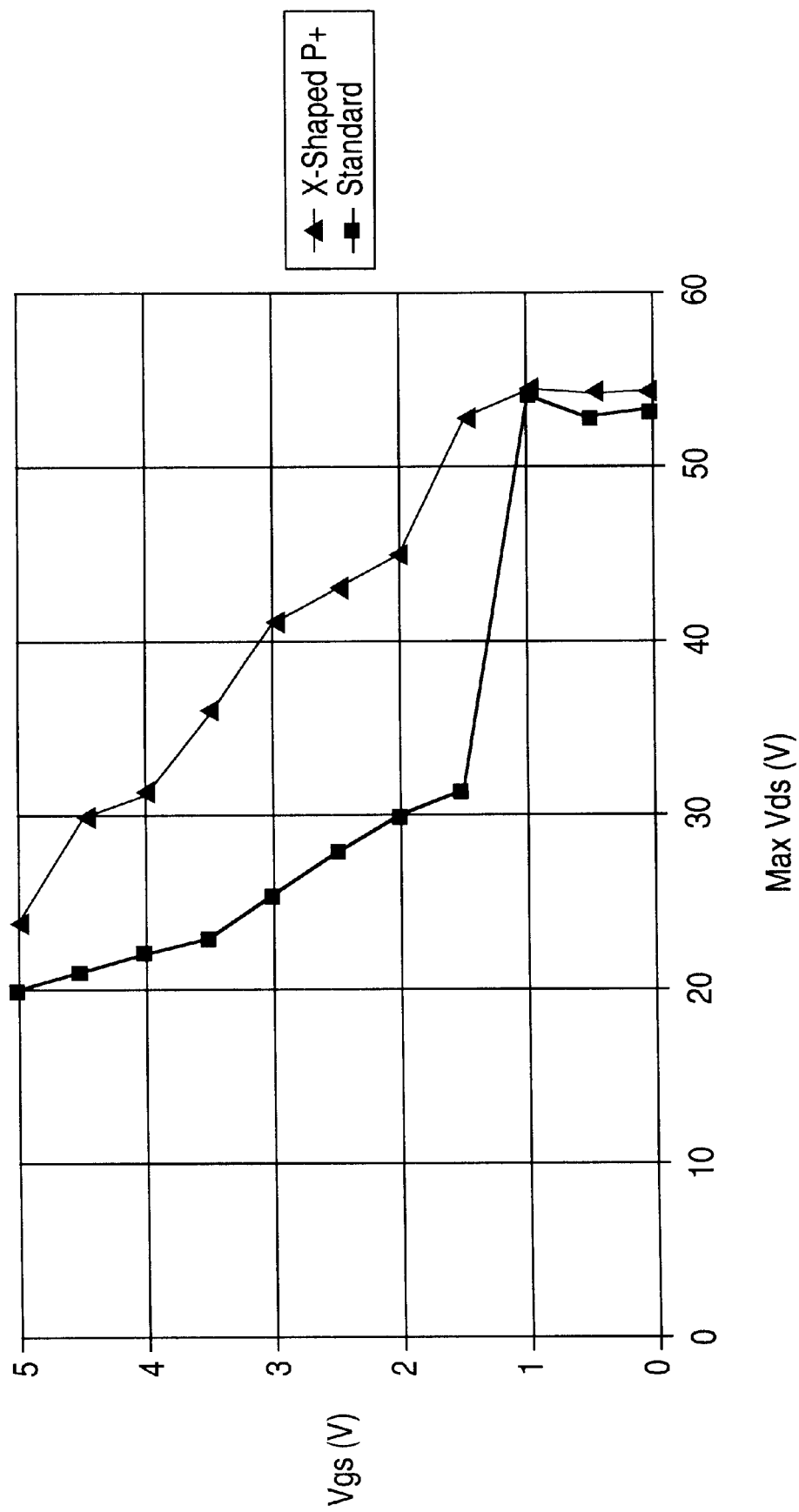
FIG. 9 is a graph illustrating the increased safe operating area (SOA) provided by the present invention.

FIG. 9 shows a graph that illustrates the increased safe operating area (SOA) provided by the present invention. As shown in FIG. 9, a range of drain-to-source voltages Vds are plotted against a range of gate-to-source voltages Vgs with squares representing the SOA boundary for transistor 100 (FIG. 1) and triangles representing the SOA boundary for transistor 600 of the present invention.

As shown in FIG. 9, transistor 600 provides a dramatic enhancement in the safe operating area. For example, at a gate-to-source voltage Vgs of 4.0V there is a 45% improvement in the snapback voltage (from approximately 22V up to approximately 32V) with only a 7% increase in cell resistance.

Thus, an example of an LDMOS transistor cell with an X-shaped body contact area has been described. The present invention improves the safe operating area of power MOSFETs, thereby allowing transistors with the cell design of the present invention to be used with a wider range of bias voltages and currents than transistors using a standard cell design.

Although the present invention has been described in terms of a square-shaped combined region 622 and an X-shaped p+ region 630, a combined region 622 can alternately have a hexagonal shape or a circular shape, while p+ region 630 can have an X shape or a +shape. (A +-shaped p+ region 630 with a square or hexagonal combined region 622 is expected to have more resistance than an X-shaped p+ region 630 with a square or hexagonal combined region 622. In addition, a X-shaped p+ region 630 with a circular combined region 622 is expected to have more resistance than an X-shaped p+ region 630 with a square or hexagonal combined region 622.)

Figure 10A:
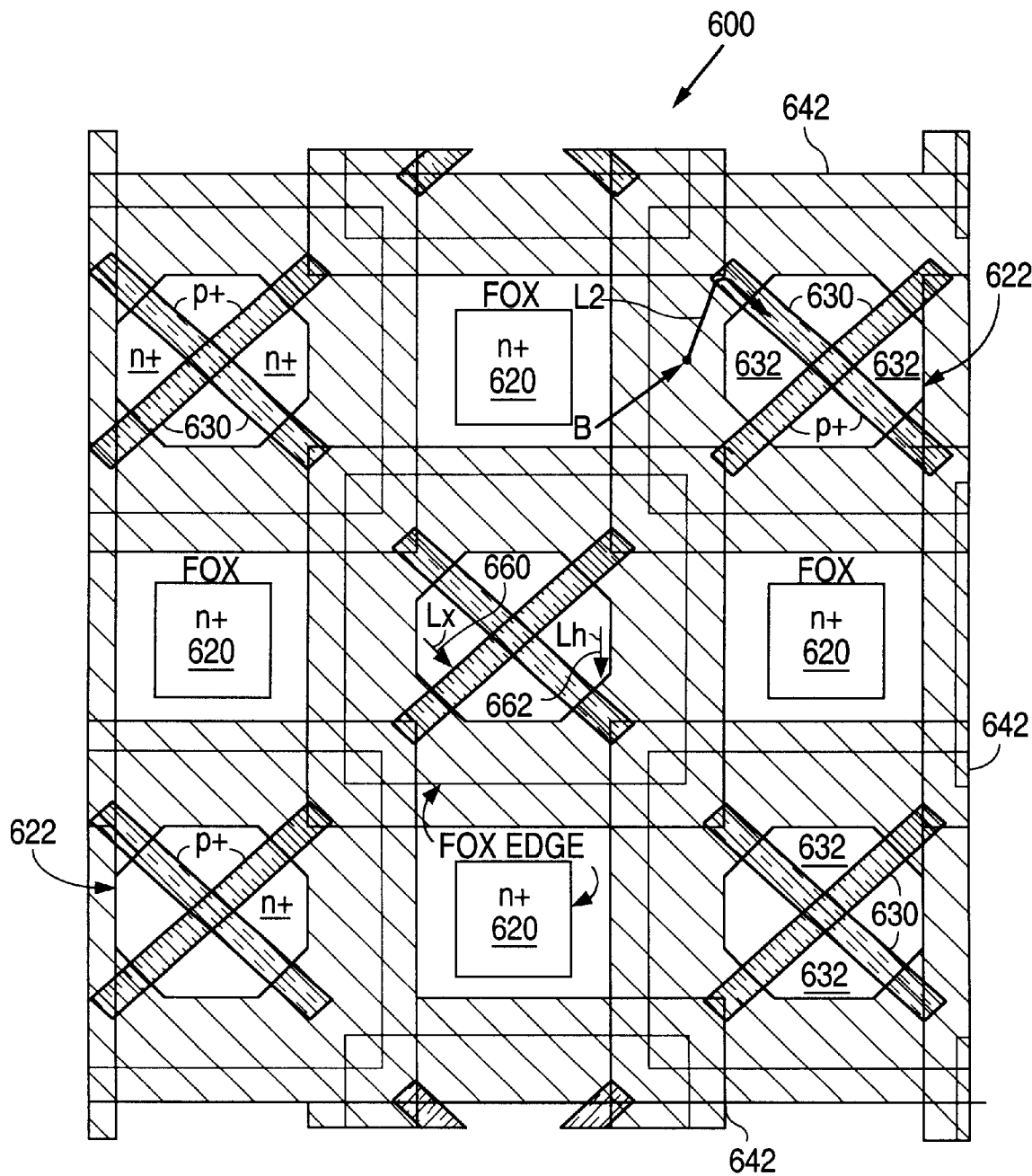
FIG. 10A is a plan view illustrating LDMOS transistor 600 with a hexagonal combined region 622 and an X-shaped p+ region 630 in accordance with the present invention.
Figure 10B:
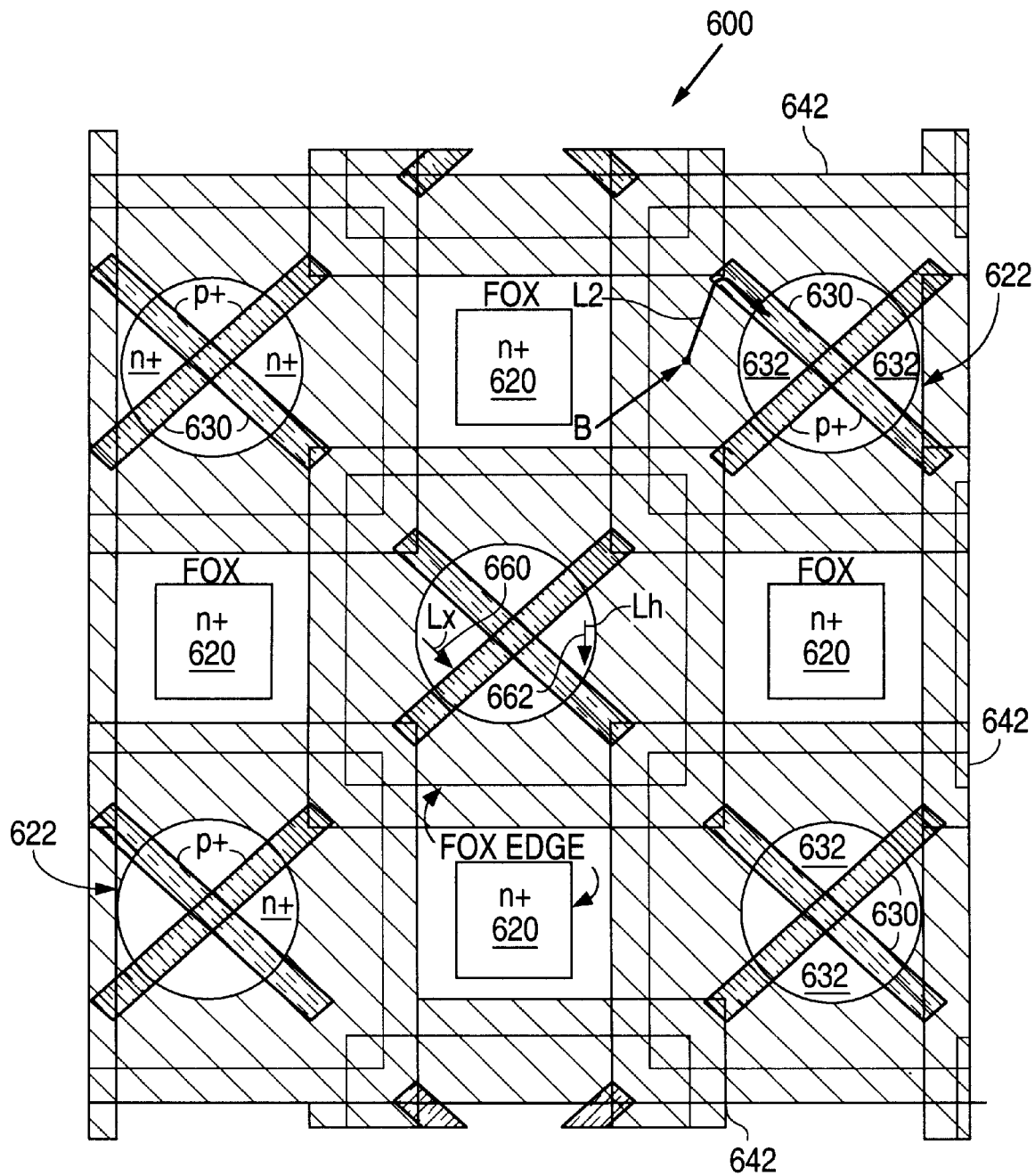
FIG. 10B is a plan view illustrating LDMOS transistor 600 with a circular combined region 622 and an X-shaped p+ region 630 in accordance with the present invention.

FIG. 10A shows a plan view that illustrates LDMOS transistor 600 with a hexagonal combined region 622 and an X-shaped p+ region 630 in accordance with the present invention. FIG. 10B shows a plan view that illustrates LDMOS transistor 600 with a circular combined region 622 and an X-shaped p+ region 630 in accordance with the present invention.

Figure 10C:
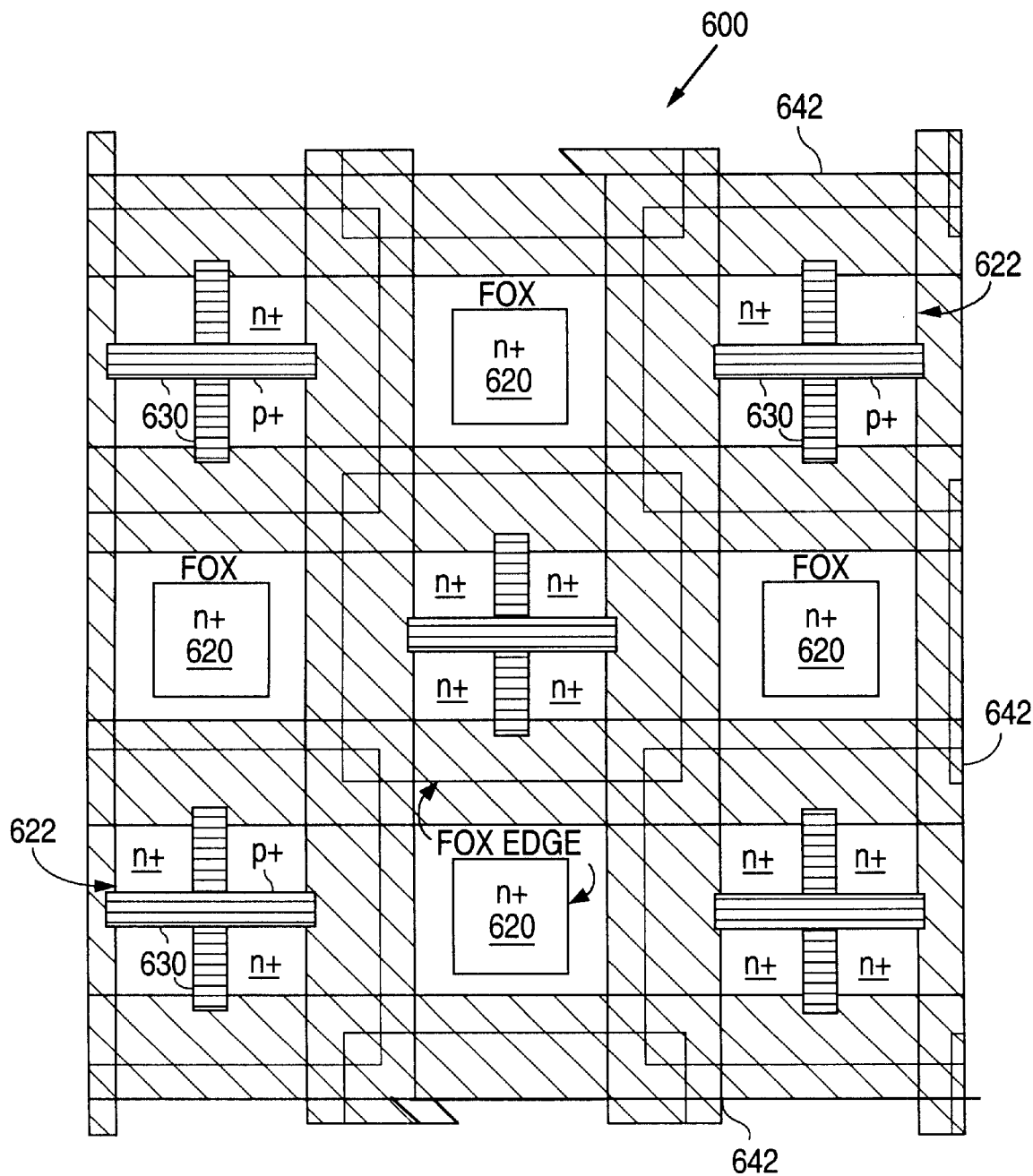
FIG. 10C is a plan view illustrating LDMOS transistor 600 with a square combined region 622 and a +-shaped p+ region 630 in accordance with the present invention.
Figure 10D:
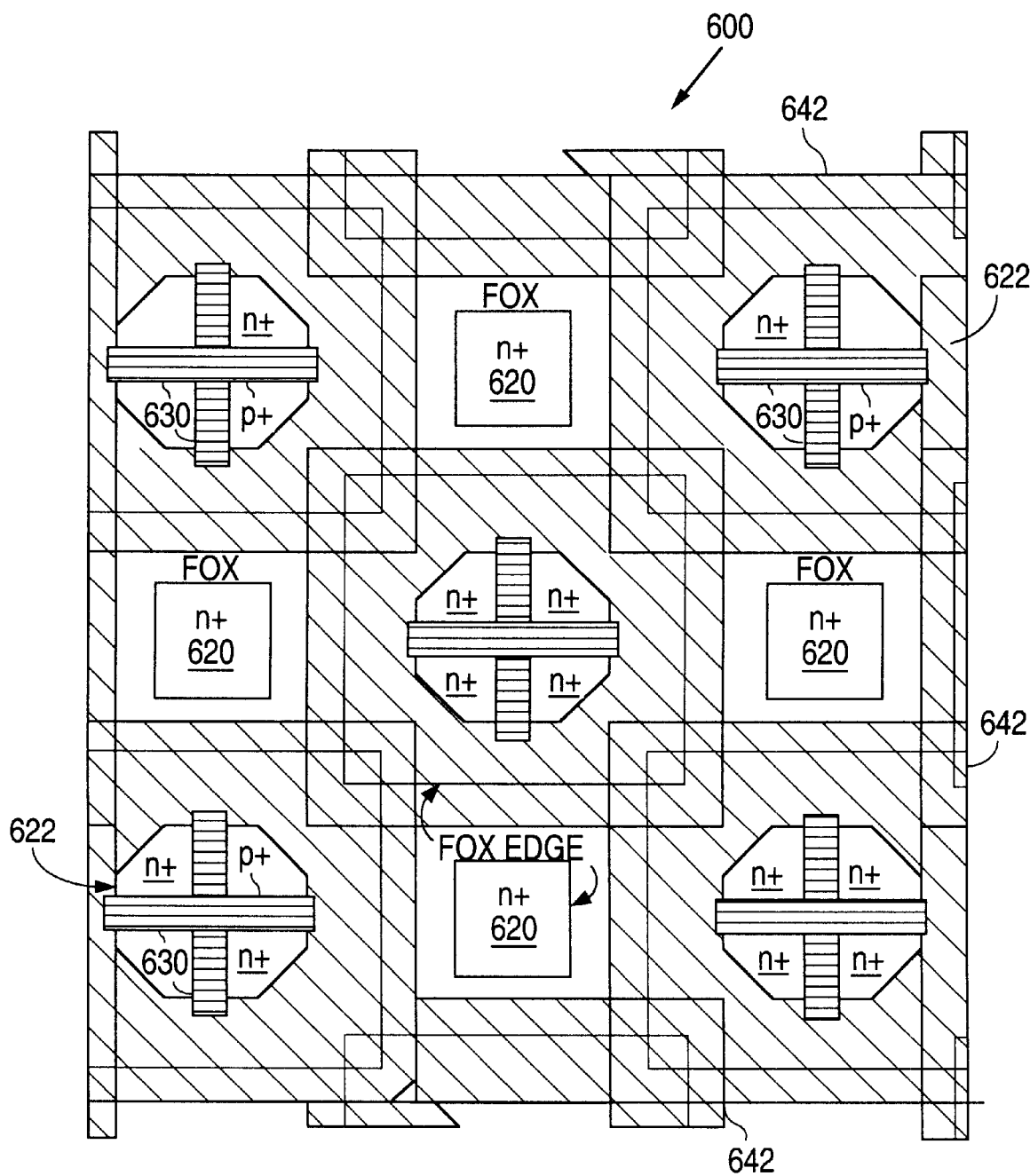
FIG. 10D is a plan view illustrating LDMOS transistor 600 with a hexagonal combined region 622 and an +-shaped p+ region 630 in accordance with the present invention.
Figure 10E:
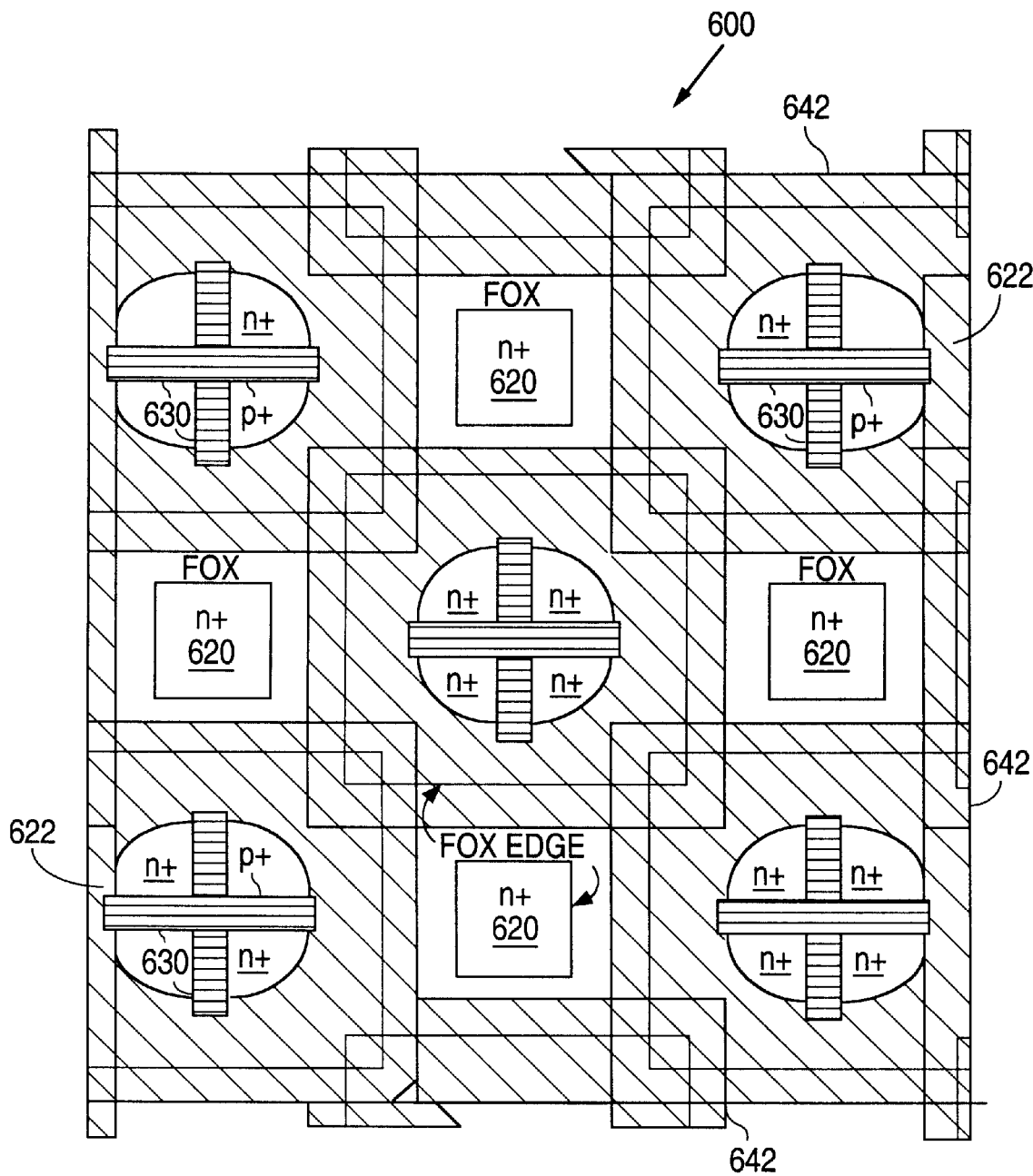
FIG. 10E is a plan view illustrating LDMOS transistor 600 with a circular combined region 622 and an +-shaped p+ region 630 in accordance with the present invention.

FIG. 10C shows a plan view that illustrates LDMOS transistor 600 with a square combined region 622 and a +-shaped p+ region 630 in accordance with the present invention. FIG. 10D shows a plan view that illustrates LDMOS transistor 600 with a hexagonal combined region 622 and a +-shaped p+ region 630 in accordance with the present invention. FIG. 10E shows a plan view that illustrates LDMOS transistor 600 with a circular combined region 622 and a +-shaped p+ region 630 in accordance with the present invention.

It should be understood that various alternatives to the method of the invention described herein may be employed in practicing the invention. For example, although the present example utilizes an LDMOS transistor, the present invention can be used with any type of power MOSFET that uses a combined source/body contact. Thus, it is intended that the following claims define the scope of the invention and that methods and structures within the scope of these claims and their equivalents be covered thereby.

What is claimed is:

1. A transistor comprising:
   a first region of semiconductor material having a first conductivity type and a first dopant concentration, the first region having a plurality of legs that extend away from a center region to form an X shape, the plurality of legs having ends;
   a second region of semiconductor material having a second conductivity type and a second dopant concentration, the second region laterally contacting adjacent legs of the first region;
   a third region of semiconductor material having the first conductivity type and a third dopant concentration that is less than the first dopant concentration, the third region laterally contacting the second region, and contacting the first region;
   a fourth region of semiconductor material having the second conductivity type and a fourth dopant concentration, the fourth region laterally contacting the third region;
   a fifth region of semiconductor material having the second conductivity type and a fifth dopant concentration, the fifth region lying laterally adjacent to the fourth region, being electrically connected to the fourth region and spaced apart from the second region, the fifth dopant concentration being substantially equivalent to the second dopant concentration;
   a layer of isolation material formed on the third region; and
   a gate segment formed on the layer of isolation material, the gate segment being straight and formed adjacent to the ends of the adjacent legs of the first region.

2. The transistor of claim 1 wherein the gate segment is formed over the adjacent legs of the first region.

3. The transistor of claim 2 wherein the layer of isolation material is also formed on a portion of the fourth region of semiconductor material, and the gate segment is also formed over the portion of the fourth region of semiconductor material.

4. The transistor of claim 2 and further comprising a region of field oxide formed between the fourth and fifth regions of semiconductor material.

5. The transistor of claim 1 wherein the second region has a substantially uniform dopant concentration.

6. The transistor of claim 1 and further comprising a sixth region of semiconductor material having the second conductivity type and a sixth dopant concentration that is less than the fifth dopant concentration, the sixth region lying below and contacting the fourth and fifth regions.

* * * * *